US009496522B2

United States Patent
Burrows et al.

(10) Patent No.: US 9,496,522 B2
(45) Date of Patent: Nov. 15, 2016

(54) OLED OPTICALLY COUPLED TO CURVED SUBSTRATE

(71) Applicant: Universal Display Corporation, Ewing, NJ (US)

(72) Inventors: Paul E. Burrows, Chattaroy, WA (US); Ruiqing Ma, Morristown, NJ (US); Gregory McGraw, Yardley, PA (US); Huiqing Pang, Newtown, PA (US)

(73) Assignee: Universal Display Corporation, Ewing, NJ (US)

( * ) Notice: Subject to any disclaimer, the term of this patent is extended or adjusted under 35 U.S.C. 154(b) by 0 days.

(21) Appl. No.: 14/106,274

(22) Filed: Dec. 13, 2013

(65) Prior Publication Data
US 2015/0171374 A1 Jun. 18, 2015

(51) Int. Cl.
*H01L 51/52* (2006.01)
*H01L 51/56* (2006.01)
*H01L 51/00* (2006.01)
*F21S 8/06* (2006.01)
*F21Y 105/00* (2016.01)

(52) U.S. Cl.
CPC ....... *H01L 51/5271* (2013.01); *H01L 51/0097* (2013.01); *H01L 51/5275* (2013.01); *H01L 51/56* (2013.01); *F21S 8/065* (2013.01); *F21Y 2105/008* (2013.01); *H01L 2251/5338* (2013.01); *H01L 2251/5361* (2013.01)

(58) Field of Classification Search
None
See application file for complete search history.

(56) References Cited

U.S. PATENT DOCUMENTS

| | | | |
|---|---|---|---|
| 4,769,292 | A | 9/1988 | Tang et al. |
| 5,247,190 | A | 9/1993 | Friend et al. |
| 5,703,436 | A | 12/1997 | Forrest et al. |
| 5,707,745 | A | 1/1998 | Forrest et al. |
| 5,834,893 | A | 11/1998 | Bulovic et al. |
| 5,844,363 | A | 12/1998 | Gu et al. |
| 6,013,982 | A | 1/2000 | Thompson et al. |
| 6,087,196 | A | 7/2000 | Sturm et al. |
| 6,091,195 | A | 7/2000 | Forrest et al. |
| 6,097,147 | A | 8/2000 | Baldo et al. |
| 6,294,398 | B1 | 9/2001 | Kim et al. |
| 6,303,238 | B1 | 10/2001 | Thompson et al. |

(Continued)

FOREIGN PATENT DOCUMENTS

EP 2669570 A2 12/2013
WO 2004051738 A2 6/2004

(Continued)

OTHER PUBLICATIONS

Baldo, et al., "Highly efficient phosphorescent emission from organic electroluminescent devices", Nature, vol. 395, pp. 151-154, 1998.

(Continued)

*Primary Examiner* — Michael Jung
(74) *Attorney, Agent, or Firm* — Morris & Kamlay LLP

(57) ABSTRACT

Devices and components are provided that include a curved outcoupling component and an OLED, where the outcoupling component provides up to 100% outcoupling of light emitted by the OLED into air. The outcoupling component has an outer radius R and includes a material with a refractive index n. The OLED is in optical communication with the outcoupling component and disposed such that each emissive element of the OLED is within a distance r measured from the center of curvature of the surface at the outer radius R, such that $R-r > (n-1)r$.

21 Claims, 13 Drawing Sheets

(56) References Cited

U.S. PATENT DOCUMENTS

| | | | |
|---|---|---|---|
| 6,337,102 | B1 | 1/2002 | Forrest et al. |
| 6,468,819 | B1 | 10/2002 | Kim et al. |
| 6,952,079 | B2 | 10/2005 | Shiang et al. |
| 6,984,934 | B2 | 1/2006 | Moeller et al. |
| 7,279,704 | B2 | 10/2007 | Walters et al. |
| 7,431,968 | B1 | 10/2008 | Shtein et al. |
| 7,678,423 | B2 | 3/2010 | Forrest et al. |
| 7,968,146 | B2 | 6/2011 | Wagner et al. |
| 8,125,138 | B2 | 2/2012 | Luttgens et al. |
| 8,179,029 | B2 | 5/2012 | Boerner et al. |
| 2003/0134488 | A1* | 7/2003 | Yamazaki et al. ............ 438/455 |
| 2003/0230980 | A1 | 12/2003 | Forrest et al. |
| 2004/0174116 | A1 | 9/2004 | Lu et al. |
| 2007/0108890 | A1 | 5/2007 | Forrest |
| 2007/0182319 | A1* | 8/2007 | Wei et al. ..................... 313/506 |
| 2010/0201256 | A1 | 8/2010 | Xue et al. |
| 2010/0258821 | A1 | 10/2010 | Forrest et al. |
| 2011/0084896 | A1* | 4/2011 | Ito ........................ H01L 51/5271 345/82 |
| 2012/0007791 | A1 | 1/2012 | Grbic et al. |
| 2012/0020085 | A1 | 1/2012 | Ikeda et al. |
| 2012/0153333 | A1 | 6/2012 | Yamazaki et al. |
| 2012/0161610 | A1 | 6/2012 | Levermore et al. |
| 2012/0228601 | A1 | 9/2012 | Hiyama et al. |
| 2013/0044487 | A1* | 2/2013 | Burrows et al. ......... 362/249.08 |
| 2013/0155052 | A1* | 6/2013 | Ko ............................... 345/419 |
| 2013/0207946 | A1* | 8/2013 | Kim et al. ................... 345/204 |
| 2013/0300697 | A1* | 11/2013 | Kim et al. ................... 345/173 |
| 2014/0002975 | A1* | 1/2014 | Lee et al. ................ 361/679.01 |
| 2014/0035869 | A1* | 2/2014 | Yun et al. ..................... 345/174 |
| 2014/0118910 | A1* | 5/2014 | Sung et al. .............. 361/679.01 |
| 2014/0264291 | A1* | 9/2014 | Zhang ................. H01L 51/5271 257/40 |
| 2014/0367644 | A1* | 12/2014 | Song et al. ..................... 257/40 |

FOREIGN PATENT DOCUMENTS

| | | |
|---|---|---|
| WO | 2008057394 | 5/2008 |
| WO | 2008139370 A1 | 11/2008 |
| WO | 2010011390 | 1/2010 |

OTHER PUBLICATIONS

Baldo, et al., "Very high-efficiency green organic light-emitting devices based on electrophosphorescence", Applied Physics Letters, vol. 75, No. 1, pp. 4-6, Jul. 5, 1999.
Bulovic, et al., "Weak microcavity effects in organic light-emitting devices", The American Physical Society, Physical Review B, vol. 58, No. 7, Aug. 15, 1998, pp. 3730-3740.
D'Andrade, et al., "Organic light-emitting device luminaire for illumination applications", Applied Physics Letters 88, 192908, 2006, http://dx.doi.org/10.1063/1.2202722, 4 pages.
Reineke, et al., "White organic light-emitting diodes with fluorescent tube efficiency", Nature, Letters, vol. 459, May 14, 2009, doi:10.1038/nature08003, pp. 234-239.
EESR for EP 14196898.2, dated Jun. 9, 2015.
EESR for EP 15168463.6 dated Aug. 11, 2016.

* cited by examiner

Off axis OLED element

RELATED ART

Luminaire constructed
from 4 radial blocks

Luminaire constructed
from 6 radial blocks

OLED OPTICALLY COUPLED TO CURVED SUBSTRATE

The claimed invention was made by, on behalf of, and/or in connection with one or more of the following parties to a joint university corporation research agreement: Regents of the University of Michigan, Princeton University, The University of Southern California, and the Universal Display Corporation. The agreement was in effect on and before the date the claimed invention was made, and the claimed invention was made as a result of activities undertaken within the scope of the agreement.

FIELD OF THE INVENTION

The present invention relates to organic light emitting devices (OLEDs). More specifically, it relates to OLEDs and luminaire including OLEDs that provide relatively high outcoupling from the OLED.

BACKGROUND

Opto-electronic devices that make use of organic materials are becoming increasingly desirable for a number of reasons. Many of the materials used to make such devices are relatively inexpensive, so organic opto-electronic devices have the potential for cost advantages over inorganic devices. In addition, the inherent properties of organic materials, such as their flexibility, may make them well suited for particular applications such as fabrication on a flexible substrate. Examples of organic opto-electronic devices include organic light emitting devices (OLEDs), organic phototransistors, organic photovoltaic cells, and organic photodetectors. For OLEDs, the organic materials may have performance advantages over conventional materials. For example, the wavelength at which an organic emissive layer emits light may generally be readily tuned with appropriate dopants.

OLEDs make use of thin organic films that emit light when voltage is applied across the device. OLEDs are becoming an increasingly interesting technology for use in applications such as flat panel displays, illumination, and backlighting. Several OLED materials and configurations are described in U.S. Pat. Nos. 5,844,363, 6,303,238, and 5,707,745, which are incorporated herein by reference in their entirety.

One application for phosphorescent emissive molecules is a full color display. Industry standards for such a display call for pixels adapted to emit particular colors, referred to as "saturated" colors. In particular, these standards call for saturated red, green, and blue pixels. Color may be measured using CIE coordinates, which are well known to the art.

One example of a green emissive molecule is tris(2-phenylpyridine) iridium, denoted Ir(ppy)$_3$, which has the following structure:

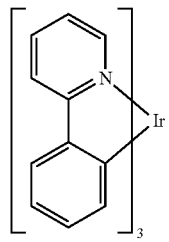

In this, and later figures herein, we depict the dative bond from nitrogen to metal (here, Ir) as a straight line.

As used herein, the term "organic" includes polymeric materials as well as small molecule organic materials that may be used to fabricate organic opto-electronic devices. "Small molecule" refers to any organic material that is not a polymer, and "small molecules" may actually be quite large. Small molecules may include repeat units in some circumstances. For example, using a long chain alkyl group as a substituent does not remove a molecule from the "small molecule" class. Small molecules may also be incorporated into polymers, for example as a pendent group on a polymer backbone or as a part of the backbone. Small molecules may also serve as the core moiety of a dendrimer, which consists of a series of chemical shells built on the core moiety. The core moiety of a dendrimer may be a fluorescent or phosphorescent small molecule emitter. A dendrimer may be a "small molecule," and it is believed that all dendrimers currently used in the field of OLEDs are small molecules.

As used herein, "top" means furthest away from the substrate, while "bottom" means closest to the substrate. Where a first layer is described as "disposed over" a second layer, the first layer is disposed further away from substrate. There may be other layers between the first and second layer, unless it is specified that the first layer is "in contact with" the second layer. For example, a cathode may be described as "disposed over" an anode, even though there are various organic layers in between.

As used herein, "solution processible" means capable of being dissolved, dispersed, or transported in and/or deposited from a liquid medium, either in solution or suspension form.

A ligand may be referred to as "photoactive" when it is believed that the ligand directly contributes to the photoactive properties of an emissive material. A ligand may be referred to as "ancillary" when it is believed that the ligand does not contribute to the photoactive properties of an emissive material, although an ancillary ligand may alter the properties of a photoactive ligand.

As used herein, and as would be generally understood by one skilled in the art, a first "Highest Occupied Molecular Orbital" (HOMO) or "Lowest Unoccupied Molecular Orbital" (LUMO) energy level is "greater than" or "higher than" a second HOMO or LUMO energy level if the first energy level is closer to the vacuum energy level. Since ionization potentials (IP) are measured as a negative energy relative to a vacuum level, a higher HOMO energy level corresponds to an IP having a smaller absolute value (an IP that is less negative). Similarly, a higher LUMO energy level corresponds to an electron affinity (EA) having a smaller absolute value (an EA that is less negative). On a conventional energy level diagram, with the vacuum level at the top, the LUMO energy level of a material is higher than the HOMO energy level of the same material. A "higher" HOMO or LUMO energy level appears closer to the top of such a diagram than a "lower" HOMO or LUMO energy level.

As used herein, and as would be generally understood by one skilled in the art, a first work function is "greater than" or "higher than" a second work function if the first work function has a higher absolute value. Because work functions are generally measured as negative numbers relative to vacuum level, this means that a "higher" work function is more negative. On a conventional energy level diagram, with the vacuum level at the top, a "higher" work function is illustrated as further away from the vacuum level in the downward direction. Thus, the definitions of HOMO and LUMO energy levels follow a different convention than work functions.

More details on OLEDs, and the definitions described above, can be found in U.S. Pat. No. 7,279,704, which is incorporated herein by reference in its entirety.

SUMMARY OF THE INVENTION

In an embodiment, a device includes a curved outcoupling component with an inner dimension r and an outer radius R and including a material with an index of refraction n, such that $R/r>n$, i.e., $R-r>(n-1)r$. At least one end of the outcoupling component may be reflective. A surface at the inner radius of the outcoupling component may be substantially parallel to a surface at the outer radius. The inner radius may include a surface defined by multiple substantially planar and/or curved surfaces. The outcoupling component may have a non-uniform thickness, i.e., r and R may be non-constant across the outcoupling component. The device also may include an OLED optically coupled to the outcoupling component. The OLED may be disposed on a surface of the outcoupling component at the inner radius r, i.e., on the inner surface of the outcoupling component. The index of refraction n of the outcoupling component may be not less than an index of refraction of the OLED. At least 98%, 99%, or more of the light incident on the OLED-facing side or sides of the outcoupling component, including the light emitted by the OLED, may be outcoupled by the outcoupling component.

In an embodiment, the outcoupling component may include a plurality of outcoupling structures, each having a corresponding index of refraction $n_s$, inner radius $r_s$, and outer radius $R_s$, where $R_s-r_s>(n_s-1)r_s$ independently for each structure. The outcoupling structures may be provided by a plurality of micro-wells, each of which corresponds to one of the outcoupling structures.

In an embodiment, the outcoupling component may be substantially toroidal. The device may include a reflective surface disposed above the outcoupling component.

In an embodiment, the OLED may be a flexible OLED disposed on a surface of the outcoupling component at the inner radius. The outcoupling component may be transparent to light emitted by the OLED.

In an embodiment, an optical coupling layer may be disposed at least partially between the OLED and the outcoupling component. The optical coupling component may have an index of refraction not less than the index of refraction of the outcoupling component.

In an embodiment, a light emitting device may be fabricated by obtaining a curved outcoupling component including a material having an index of refraction n, where the component has an inner radius r and an outer radius R, such that $R-r>(n-1)r$. An OLED may be placed in optical communication with the curved outcoupling component. For example, the OLED may be deposited on an inner surface of the outcoupling component located at the radius r. As another example, a flexible OLED may be attached to the curved outcoupling component, such as by lamination, encapsulation or the like.

DETAILED DESCRIPTION

Generally, an OLED comprises at least one organic layer disposed between and electrically connected to an anode and a cathode. When a current is applied, the anode injects holes and the cathode injects electrons into the organic layer(s). The injected holes and electrons each migrate toward the oppositely charged electrode. When an electron and hole localize on the same molecule, an "exciton," which is a localized electron-hole pair having an excited energy state, is formed. Light is emitted when the exciton relaxes via a photoemissive mechanism. In some cases, the exciton may be localized on an excimer or an exciplex. Non-radiative mechanisms, such as thermal relaxation, may also occur, but are generally considered undesirable.

The initial OLEDs used emissive molecules that emitted light from their singlet states ("fluorescence") as disclosed, for example, in U.S. Pat. No. 4,769,292, which is incorporated by reference in its entirety. Fluorescent emission generally occurs in a time frame of less than 10 nanoseconds.

More recently, OLEDs having emissive materials that emit light from triplet states ("phosphorescence") have been demonstrated. Baldo et al., "Highly Efficient Phosphorescent Emission from Organic Electroluminescent Devices," Nature, vol. 395, 151-154, 1998; ("Baldo-I") and Baldo et al., "Very high-efficiency green organic light-emitting devices based on electrophosphorescence," Appl. Phys. Lett., vol. 75, No. 3, 4-6 (1999) ("Baldo-II"), which are incorporated by reference in their entireties. Phosphorescence is described in more detail in U.S. Pat. No. 7,279,704 at cols. 5-6, which are incorporated by reference.

Figure 1:
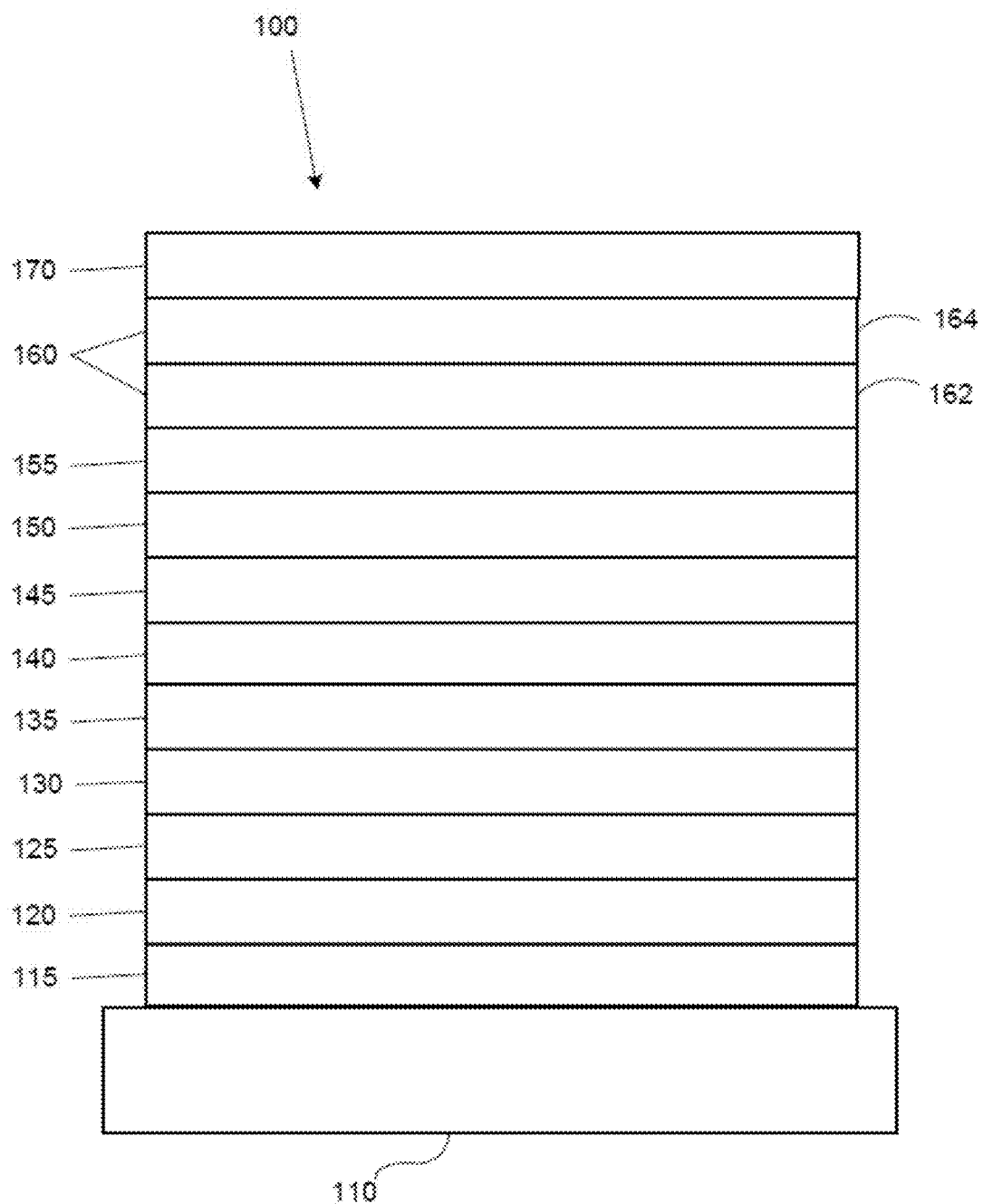
FIG. 1 shows an organic light emitting device.

FIG. 1 shows an organic light emitting device 100. The figures are not necessarily drawn to scale. Device 100 may include a substrate 110, an anode 115, a hole injection layer 120, a hole transport layer 125, an electron blocking layer 130, an emissive layer 135, a hole blocking layer 140, an electron transport layer 145, an electron injection layer 150, a protective layer 155, a cathode 160, and a barrier layer 170. Cathode 160 is a compound cathode having a first conductive layer 162 and a second conductive layer 164. Device 100 may be fabricated by depositing the layers described, in order. The properties and functions of these various layers, as well as example materials, are described in more detail in U.S. Pat. No. 7,279,704 at cols. 6-10, which are incorporated by reference.

More examples for each of these layers are available. For example, a flexible and transparent substrate-anode combination is disclosed in U.S. Pat. No. 5,844,363, which is incorporated by reference in its entirety. An example of a p-doped hole transport layer is m-MTDATA doped with $F_4$-TCNQ at a molar ratio of 50:1, as disclosed in U.S. Patent Application Publication No. 2003/0230980, which is incorporated by reference in its entirety. Examples of emissive and host materials are disclosed in U.S. Pat. No. 6,303,238 to Thompson et al., which is incorporated by reference in its entirety. An example of an n-doped electron transport layer is BPhen doped with Li at a molar ratio of 1:1, as disclosed in U.S. Patent Application Publication No. 2003/0230980, which is incorporated by reference in its entirety. U.S. Pat. Nos. 5,703,436 and 5,707,745, which are incorporated by reference in their entireties, disclose examples of cathodes including compound cathodes having a thin layer of metal such as Mg:Ag with an overlying transparent, electrically-conductive, sputter-deposited ITO layer. The theory and use of blocking layers is described in more detail in U.S. Pat. No. 6,097,147 and U.S. Patent Application Publication No. 2003/0230980, which are incorporated by reference in their entireties. Examples of injection layers are provided in U.S. Patent Application Publication No. 2004/0174116, which is incorporated by reference in its entirety. A description of protective layers may be found in U.S. Patent Application Publication No. 2004/0174116, which is incorporated by reference in its entirety.

Figure 2:
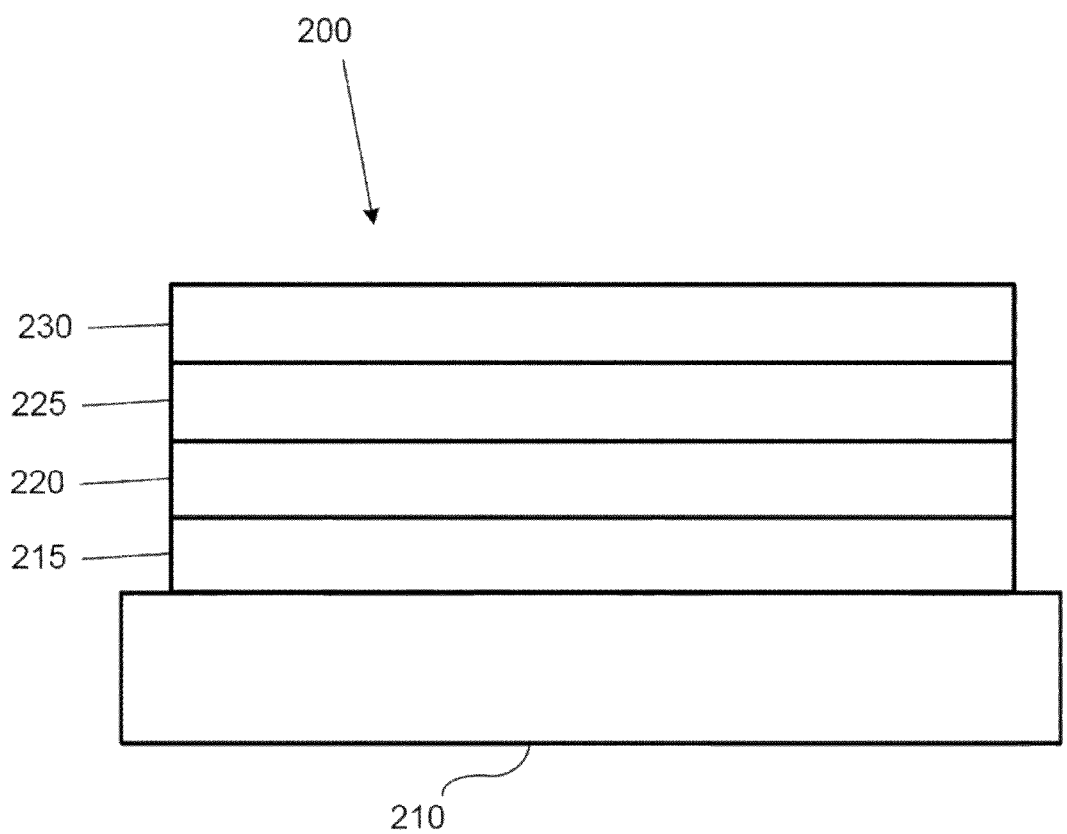
FIG. 2 shows an inverted organic light emitting device that does not have a separate electron transport layer.

FIG. 2 shows an inverted OLED 200. The device includes a substrate 210, a cathode 215, an emissive layer 220, a hole transport layer 225, and an anode 230. Device 200 may be fabricated by depositing the layers described, in order. Because the most common OLED configuration has a cathode disposed over the anode, and device 200 has cathode 215 disposed under anode 230, device 200 may be referred to as an "inverted" OLED. Materials similar to those described with respect to device 100 may be used in the corresponding layers of device 200. FIG. 2 provides one example of how some layers may be omitted from the structure of device 100.

The simple layered structure illustrated in FIGS. 1 and 2 is provided by way of non-limiting example, and it is understood that embodiments of the invention may be used in connection with a wide variety of other structures. The specific materials and structures described are exemplary in nature, and other materials and structures may be used. Functional OLEDs may be achieved by combining the various layers described in different ways, or layers may be omitted entirely, based on design, performance, and cost factors. Other layers not specifically described may also be included. Materials other than those specifically described may be used. Although many of the examples provided herein describe various layers as comprising a single material, it is understood that combinations of materials, such as a mixture of host and dopant, or more generally a mixture, may be used. Also, the layers may have various sublayers. The names given to the various layers herein are not intended to be strictly limiting. For example, in device 200, hole transport layer 225 transports holes and injects holes into emissive layer 220, and may be described as a hole transport layer or a hole injection layer. In one embodiment, an OLED may be described as having an "organic layer" disposed between a cathode and an anode. This organic layer may comprise a single layer, or may further comprise multiple layers of different organic materials as described, for example, with respect to FIGS. 1 and 2.

Structures and materials not specifically described may also be used, such as OLEDs comprised of polymeric materials (PLEDs) such as disclosed in U.S. Pat. No. 5,247,190 to Friend et al., which is incorporated by reference in its entirety. By way of further example, OLEDs having a single organic layer may be used. OLEDs may be stacked, for example as described in U.S. Pat. No. 5,707,745 to Forrest et al, which is incorporated by reference in its entirety. The OLED structure may deviate from the simple layered structure illustrated in FIGS. 1 and 2. For example, the substrate may include an angled reflective surface to improve outcoupling, such as a mesa structure as described in U.S. Pat. No. 6,091,195 to Forrest et al., and/or a pit structure as described in U.S. Pat. No. 5,834,893 to Bulovic et al., which are incorporated by reference in their entireties.

Unless otherwise specified, any of the layers of the various embodiments may be deposited by any suitable method. For the organic layers, preferred methods include thermal evaporation, ink-jet, such as described in U.S. Pat. Nos. 6,013,982 and 6,087,196, which are incorporated by reference in their entireties, organic vapor phase deposition (OVPD), such as described in U.S. Pat. No. 6,337,102 to Forrest et al., which is incorporated by reference in its entirety, and deposition by organic vapor jet printing (OVJP), such as described in U.S. Pat. No. 7,431,968, which is incorporated by reference in its entirety. Other suitable deposition methods include spin coating and other solution based processes. Solution based processes are preferably carried out in nitrogen or an inert atmosphere. For the other layers, preferred methods include thermal evaporation. Preferred patterning methods include deposition through a mask, cold welding such as described in U.S. Pat. Nos. 6,294,398 and 6,468,819, which are incorporated by reference in their entireties, and patterning associated with some of the deposition methods such as ink-jet and OVJP. Other methods may also be used. The materials to be deposited may be modified to make them compatible with a particular deposition method. For example, substituents such as alkyl and aryl groups, branched or unbranched, and preferably containing at least 3 carbons, may be used in small molecules to enhance their ability to undergo solution processing. Substituents having 20 carbons or more may be used, and 3-20 carbons is a preferred range. Materials with asymmetric structures may have better solution processibility than those having symmetric structures, because asymmetric materials may have a lower tendency to recrystallize. Dendrimer substituents may be used to enhance the ability of small molecules to undergo solution processing.

Devices fabricated in accordance with embodiments of the present invention may further optionally comprise a barrier layer. One purpose of the barrier layer is to protect the electrodes and organic layers from damaging exposure to harmful species in the environment including moisture, vapor and/or gases, etc. The barrier layer may be deposited over, under or next to a substrate, an electrode, or over any other parts of a device including an edge. The barrier layer may comprise a single layer, or multiple layers. The barrier layer may be formed by various known chemical vapor deposition techniques and may include compositions having a single phase as well as compositions having multiple phases. Any suitable material or combination of materials may be used for the barrier layer. The barrier layer may incorporate an inorganic or an organic compound or both. The preferred barrier layer comprises a mixture of a polymeric material and a non-polymeric material as described in U.S. Pat. No. 7,968,146, PCT Pat. Application Nos. PCT/US2007/023098 and PCT/US2009/042829, which are herein incorporated by reference in their entireties. To be considered a "mixture", the aforesaid polymeric and non-polymeric materials comprising the barrier layer should be deposited under the same reaction conditions and/or at the same time. The weight ratio of polymeric to non-polymeric material may be in the range of 95:5 to 5:95. The polymeric material and the non-polymeric material may be created from the same precursor material. In one example, the mixture of a polymeric material and a non-polymeric material consists essentially of polymeric silicon and inorganic silicon.

Devices fabricated in accordance with embodiments of the invention may be incorporated into a wide variety of consumer products, including flat panel displays, computer monitors, medical monitors, televisions, billboards, lights for interior or exterior illumination and/or signaling, heads up displays, fully transparent displays, flexible displays, laser printers, telephones, cell phones, personal digital assistants (PDAs), laptop computers, digital cameras, camcorders, viewfinders, micro-displays, 3-D displays, vehicles, a large area wall, theater or stadium screen, or a sign. Various control mechanisms may be used to control devices fabricated in accordance with the present invention, including passive matrix and active matrix. Many of the devices are intended for use in a temperature range comfortable to humans, such as 18 degrees C. to 30 degrees C., and more preferably at room temperature (20-25 degrees C.), but could be used outside this temperature range, for example, from −40 degree C. to +80 degree C.

The materials and structures described herein may have applications in devices other than OLEDs. For example, other optoelectronic devices such as organic solar cells and organic photodetectors may employ the materials and structures. More generally, organic devices, such as organic transistors, may employ the materials and structures.

The terms halo, halogen, alkyl, cycloalkyl, alkenyl, alkynyl, aralkyl, heterocyclic group, aryl, aromatic group, and heteroaryl are known to the art, and are defined in U.S. Pat. No. 7,279,704 at cols. 31-32, which are incorporated herein by reference.

The refractive index of OLED materials, $n_s$, typically lies between 1.65 and 1.75. Selecting a substrate of equal or higher refractive index can force all of the emitted light into the substrate, ignoring polarization effects and Fresnel reflection. The passage of light through the substrate/air interface, however, is typically limited by total internal reflection. Only light rays with an angle of incidence, i, less than the critical angle, $\Gamma_c$, can escape. The critical angle is easily calculated from Snell's law n sin i=sin r, where n is the refractive index of the substrate (assuming $n_{air}=1.0$) and r is the angle of refraction into air. Setting r=90° for a barely emergent ray, it follows that $\theta=\sin^{-1}(1/n)$ which is 37.3° for $n_s=1.65$ and 34.8° for $n_s=1.75$. Rays incident at an i greater than $\theta_c$ are confined to the substrate.

One solution to enhance outcoupling efficiency may be to use a curved surface that is much larger than the OLED. Outcoupling enhancement thus be obtained by a large lens, an array of small lenses, or a single, shaped block of material are generally known. For example, for an inorganic LED, close to 100% outcoupling can be achieved by placing the LED at the center of a spherical lens of transparent, high refractive index material. This, along with shaping the light-emitting semiconductor die itself, is has been implemented in conventional LED manufacturing processes to achieve close to 100% outcoupling of light generated inside the device.

Figure 3:
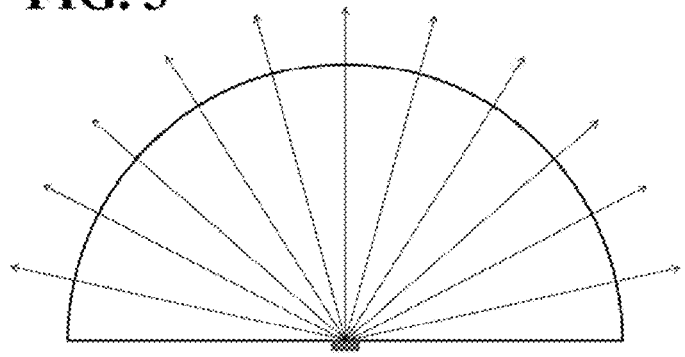
FIG. 3 shows an example of a small OLED or OLED segment disposed on the optical axis of a spherical outcoupling component.

This principle has also been applied to OLEDs, such as using by using configurations as shown in FIG. 3. However, 100% outcoupling efficiency typically is only achievable when the block is very large relative to the size of the OLED, so that all rays hitting the outcoupling surface of the block are essentially normal to the surface. This results in relatively large and often bulky luminaire, and also a very small fill factor and low luminaire brightness. These typically are undesirable attributes for a general lighting luminaire, and thus the use of such blocks has generally remained confined to laboratory settings. Blocks with at least one non-spherical surface have also been disclosed, such as in U.S. Patent Publication No. 2012/0161610, the disclosure of which is incorporated by reference in its entirety. However, such configurations typically use a flat OLED.

Figure 4:
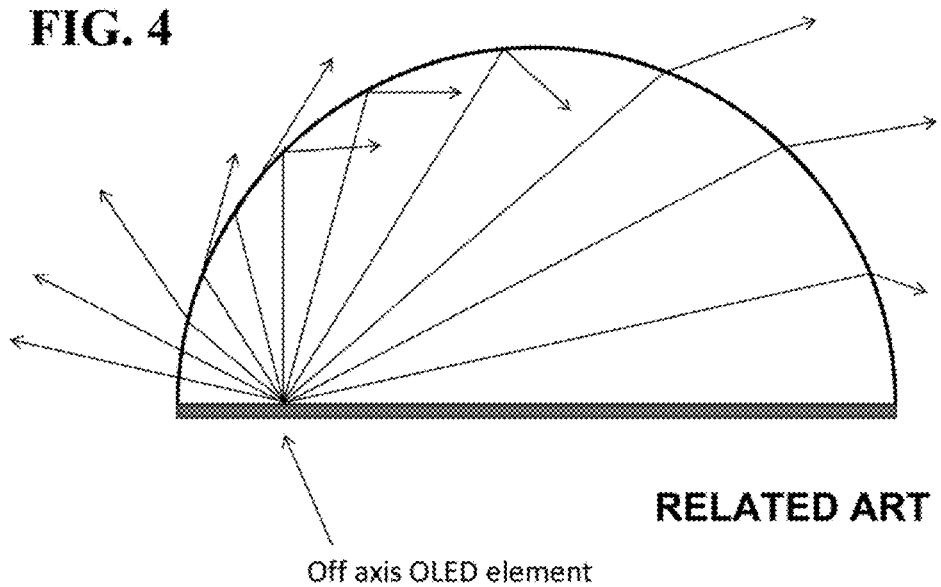
FIG. 4 shows an OLED disposed on the optical axis of a spherical outcoupling component.

OLED devices such as luminaire typically are extended area, dilute light sources. In such arrangements, outcoupling enhancement must be achieved over a relatively larger area. Advantageously, this may allow for the elimination of a diffuser or shade that is required to prevent glare from a point light source. Placing a dome or a microlens array over a spatially extended source also increases the outcoupling efficiency over that of a flat substrate, because an element of the OLED lying directly beneath the optical axis of a lens outcouples all the emitted light. However, this efficiency decreases for elements that are far from the optical axis. Parts of the OLED near the edge of the lens may experience significant total internal reflection, as shown in FIG. 4.

Structures and methods for making an OLED with up to 100% extraction of substrate modes into the air are provided herein. The structure can be made, for example, by direct deposition of an OLED on a curved surface, or by lamination of a flexible OLED (FOLED) to a pre-formed curved outcoupling block. Coupled with a substrate material of equal refractive index to the organic layers (~1.71), such configurations may enable OLEDs with 100% outcoupling efficiency in a useful form factor.

More specifically, in an embodiment a device as disclosed herein may include a curved outcoupling component as described in further detail below. The outcoupling component may include or be fabricated entirely or primarily from a material having a refractive index n, and may have an inner dimension r measured from the center of curvature of the outer surface at an outer radius R, such that $R-r>(n-1)r$. More generally, the inner surface may be of arbitrary shape, so long as all light emitting elements on that surface are located within radius r of the center of curvature of the outer surface of the outcoupling structure, and a clear line-of-sight path through the outcoupler exists between each emissive element and the outer surface for every possible ray emitted from that element. The device may further include an OLED optically coupled to the outcoupling component, such that light emitted by the OLED can travel into the outcoupling component. Such a device may allow for up to 100%, up to 99%, up to 98%, or any other percentage of light incident on the OLED-facing surface of the outcoupling component, including light emitted by the OLED, to be outcoupled by the outcoupling component.

In contrast to prior work that relies upon a flat OLED, embodiments disclosed herein may use concentrically curved surfaces, to which an OLED is matched in curvature to permit up to 100% outcoupling efficiency in the plane of the curve. Curved lighting surfaces are only possible with an OLED. Complete outcoupling may be obtained so long as each emissive element is within a distance r of the center of an outcoupler with radius R. As disclosed herein, other arrangements may be used that approximate a curved OLED, or construct a functionally curved OLED from multiple slightly curved and/or planar OLEDs, achieving substantially or entirely the same effect.

Figure 5:
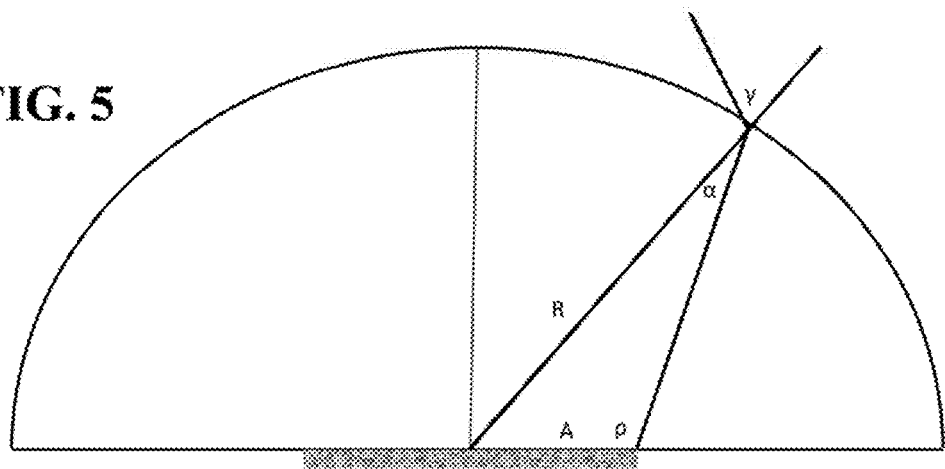
FIG. 5 shows a geometric construction to derive the condition for perfect outcoupling from a spatially extended OLED centered on the optical axis of a spherical outcoupling component according to an embodiment of the invention.

Generally, to achieve 100% outcoupling from a flat, circular OLED centered on the axis of a spherical lens, the radius of the OLED, A, should be less than $R/n_{sphere}$, where R is the radius of the outcoupling sphere as shown in FIG. 5. This limit can be derived directly from the combination of the sine rule, $A/(\sin \alpha)=R/(\sin \rho)$, with the outcoupling condition $\sin \alpha \leq 1/n$, which implies the condition $A \sin \rho \leq R/n$ for outcoupling to occur. Since $\sin \rho \leq 1$ for all values of $\rho$, this condition is satisfied for all angles if and only if $A \leq R/n$. This condition is consistent with data determined using ray tracing that an OLED should be smaller than the corresponding spherical outcoupling component for optimal outcoupling efficiency. Typically in such a configuration the OLED efficiency increases with decreasing OLED size, but becomes asymptotic to a maximum value below a size roughly consistent with the condition $A \leq R/n$. The asymptote is less than 100% because the ray tracing model also takes account of Fresnel reflection at the outcoupling component—air interface. The present disclosure shows analytically why this result is obtained, as described in further detail below.

Figure 6:
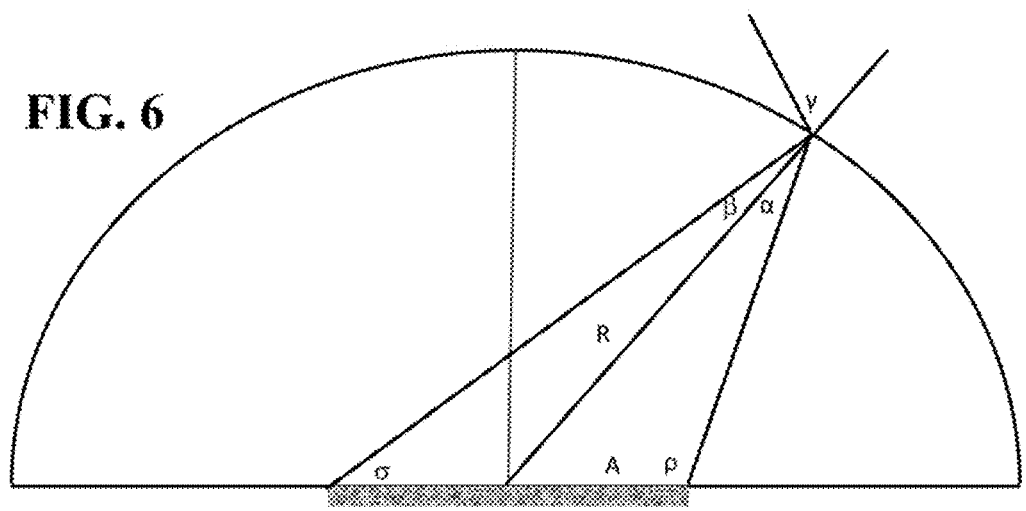
FIG. 6 shows a geometric construction to derive the condition for perfect outcoupling from a spatially extended OLED centered on the optical axis of a spherical outcoupling component according to an embodiment of the invention.

FIG. 6 shows the path of a light ray from the opposite edge of the OLED. In this case $\sin \alpha/\sin \beta = \sin \rho/\sin \sigma$ and $\rho \geq s$, so $a \geq b$ for all values of a and b. Thus, all the light from the OLED outcouples from the sphere if $A \leq R/n$. An outcoupling dome that satisfies this condition typically is much larger and heavier than the OLED itself. Embodiments disclosed herein provide improvement over such a configuration.

Figure 7:
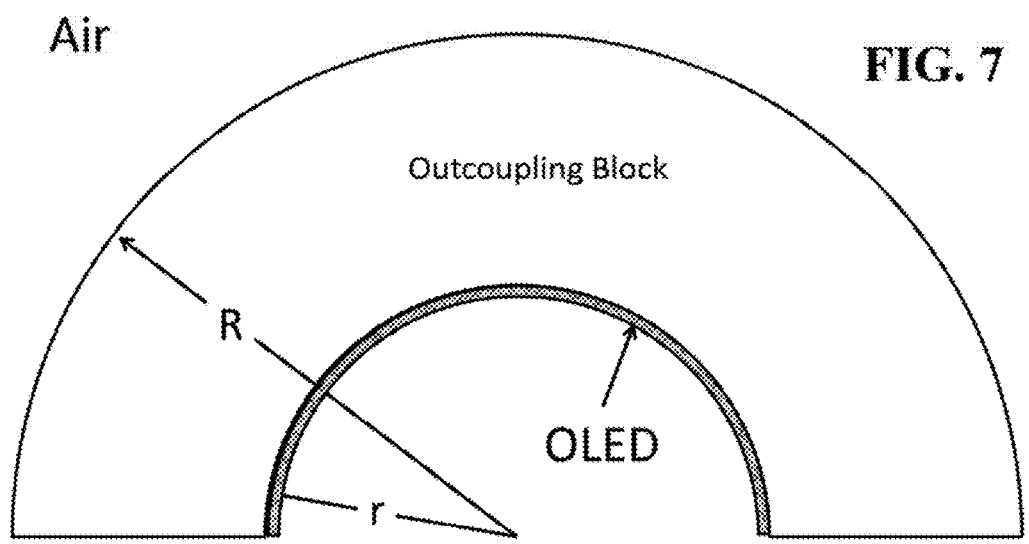
FIG. 7 shows a schematic illustration of an outcoupling component according to an embodiment of the invention.

FIG. 7 shows an example of an embodiment of the invention that provides up to 100% outcoupling efficiency, with more light output and a lighter weight luminaire than is otherwise achievable. The configuration includes two curved surfaces that may be circular and concentric. The outcoupling component has an inner radius r and an outer radius R. The outcoupling component may have radii selected such that $R-r>(n-1)r$, where n is the index of refraction of the outcoupling component. In an embodiment the outcoupling component may be separate from the OLED substrate. The surfaces at R and r may be partially or entirely parallel, i.e., the outcoupling component may have a constant thickness across its length as measured parallel to the surfaces at the outer and inner radii.

It may be preferred that the outcoupling component is index-matched to the OLED substrate. In some configurations, an optical coupling layer such as an index-matching fluid may be at least partially disposed between the OLED and the outcoupling component. More generally, it may be preferred that the index of refraction of the outcoupling component is not less than an index of refraction of the OLED. The outcoupling component may be a part of the OLED substrate itself, or the OLED may be deposited on a flexible substrate and laminated to the outcoupling component. The OLED may be deposited directly onto the inner curved surface, for example by vacuum deposition, printing, or some other known technique. Although circular surfaces are shown for simplicity of illustration, other non-circular, curved surfaces where both the OLED and the outcoupling surface are curved also may be used. Thus, in some cases, the inner distance r and the outer radius R of an outcoupling component may not be constant across the component. In some configurations, the thickness R−r of the component may be constant even though the radii are not. In some configurations, the thickness also may vary across the component. In configurations having a non-constant thickness, the minimum thickness of the component may be matched to the index of refraction of the component to meet the outcoupling criteria disclosed herein.

In addition to non-circular outcoupling components, segmented, non-planar surfaces may be used as disclosed in further detail herein.

Figure 8:
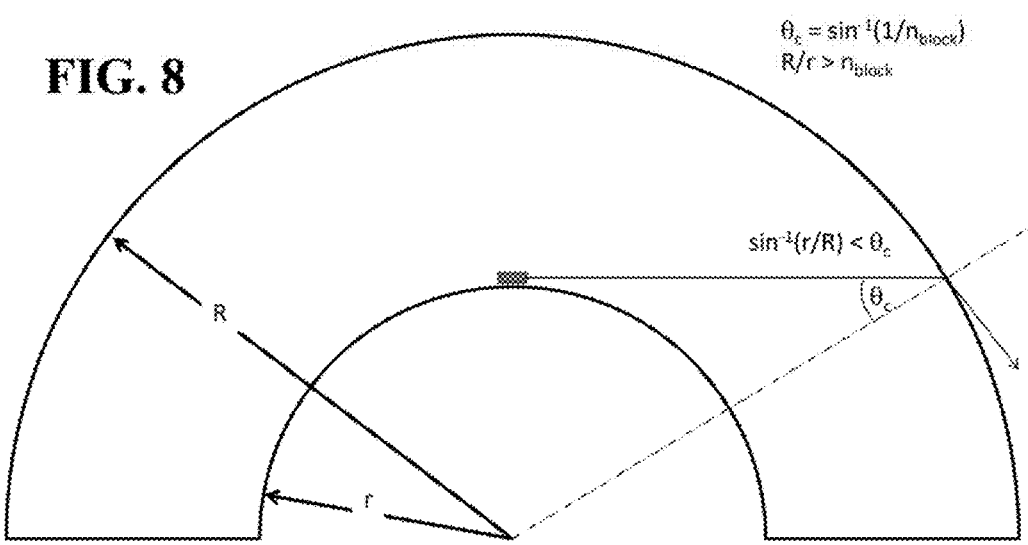
FIG. 8 shows a schematic representation of an outcoupling component according to an embodiment of the invention, with a construction for deriving the condition for the highest possible angle light from the OLED element to exit the outcoupling component.

FIG. 8 shows a criterion for a curved outcoupling component to provide a near-perfect outcoupling component, i.e., an outcoupling component that provides up to 100% outcoupling, neglecting Fresnel reflection. The highest angle light emitted from the illustrative small OLED element shown at the center of the outcoupling component will follow the path shown. All other light rays will intersect the outcoupling surface at a smaller angle. Therefore, if this ray is outcoupled from the outcoupling component (i.e. is incident on the outcoupling component at less than $\theta_c$), then all rays from this element will be outcoupled. As shown in FIG. 6, the outcoupling condition is defined by the geometrical relation $\sin^{-1}(r/R) < \theta_c$. From the previously derived equation for $\theta_c$, this reduces to $R/r > n_{block}$, where $n_{block}$ is the refractive index of the outcoupling component.

Figure 9:
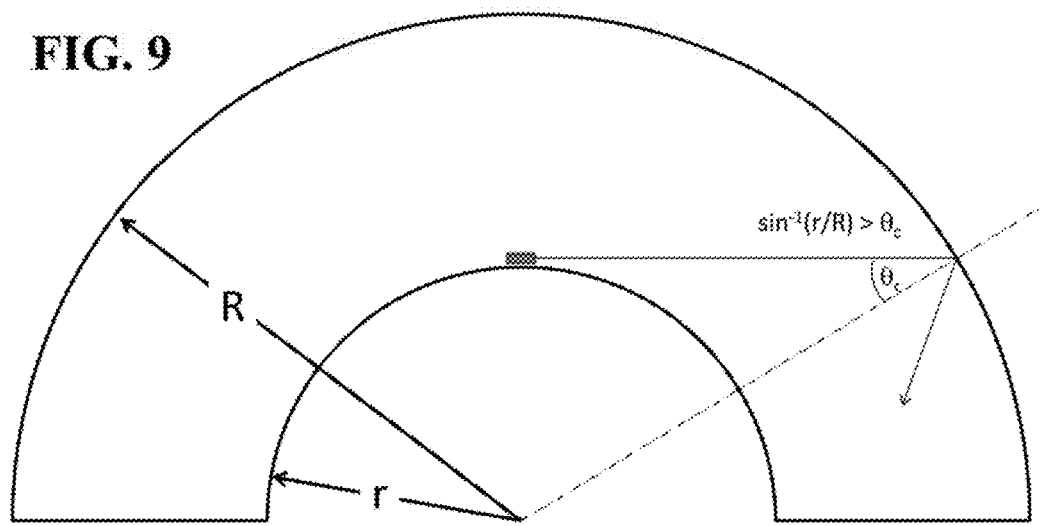
FIG. 9 shows a schematic representation of an outcoupling component according to an embodiment of the invention, showing total internal reflection of the highest angle light ray from the OLED element.
Figure 10:
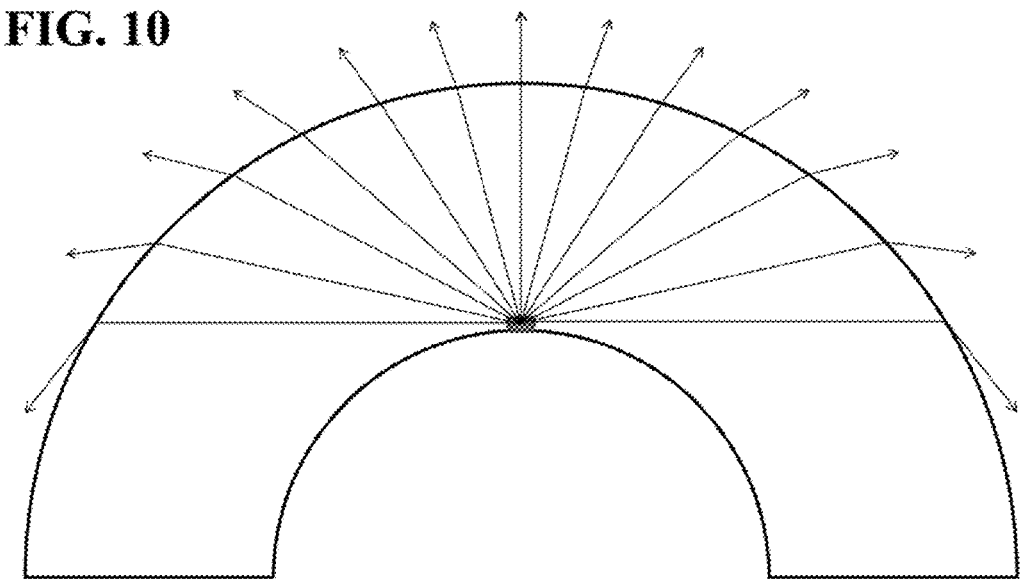
FIG. 10 shows an Illustration of rays emitted by the OLED element exit an outcoupling component according to an embodiment of the invention if a critical thickness criterion from the highest angle ray is satisfied.

FIG. 9 shows that in the alternate condition $\sin^{-1}(r/R) > \theta_c$, the highest angle ray from the small OLED element will be totally internally reflected, in which case the outcoupling efficiency will be less than 100%. FIG. 10 shows a visual summary of the behavior of illustrative rays emitted at all angles from the OLED element.

Figure 11:
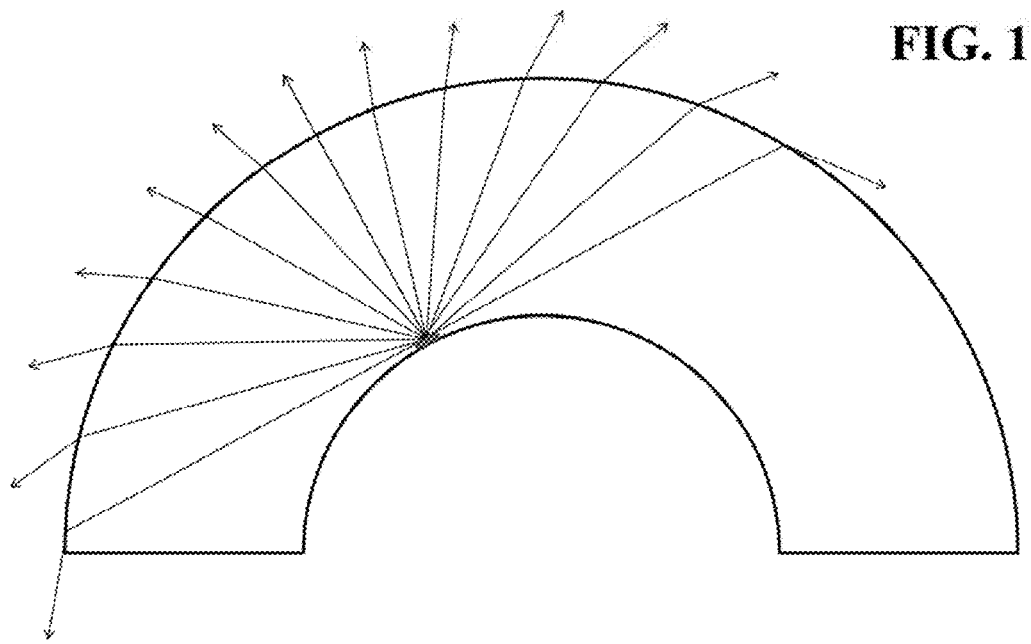
FIG. 11 shows an illustration of circular symmetry resulting in 100% outcoupling for all OLED elements regardless of position from the optical axis according to an embodiment of the invention.
Figure 12:
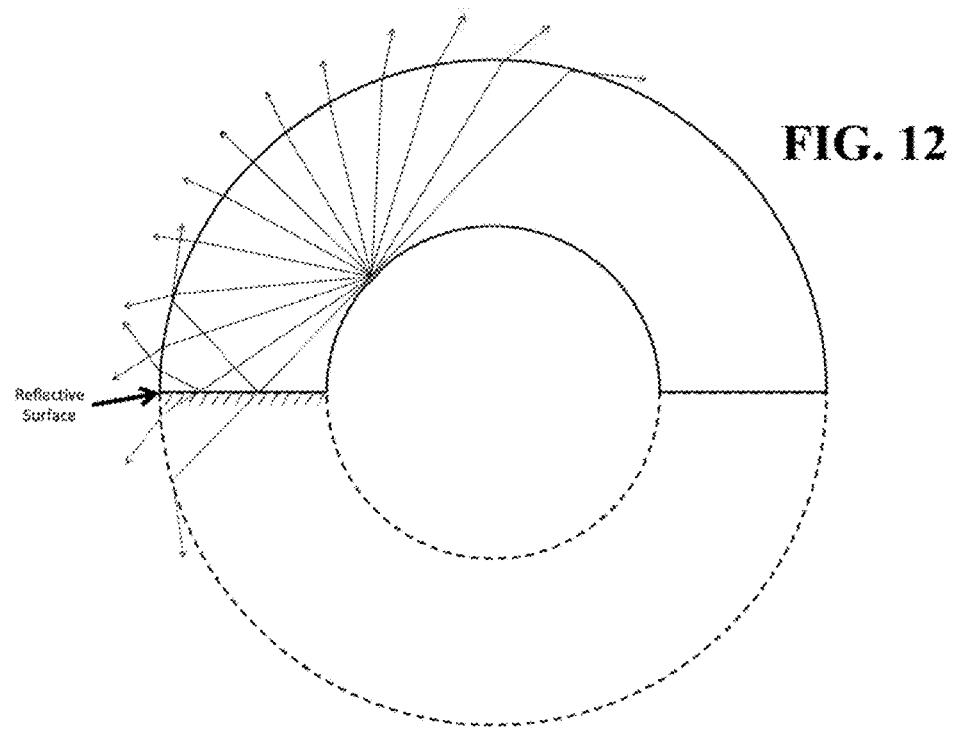
FIG. 12 shows an illustration of an outcoupling component including a reflector according to an embodiment of the invention.

The same analysis applies to other elements of an OLED disposed around the small radius of the outcoupling component by invoking circular symmetry as shown in FIG. 11. FIG. 12 shows the behavior of rays that originate from an element sufficiently far around the curved surface that the rays are incident on the flat edge of the outcoupling component. If this edge is made reflective, for example by coating the surface with a reflective metal or a dielectric reflector stack, then the angle of incidence is equal to the angle of reflection and the rays will still emerge as if the outcoupling component was virtually extended to be a full circle. A curved outcoupling component satisfying the critical thickness may be expected to outcouple all light that is emitted into the substrate from the OLED, less small reflective losses from its mirror coated ends. Thus, in some embodiments, at least one end of an outcoupling component as previously described may be reflective.

Figure 13:
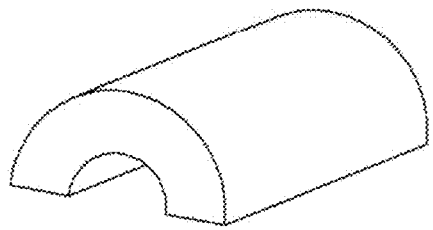
FIG. 13 shows a luminaire including a curved outcoupling component in one dimension (cylindrical) according to an embodiment of the invention.

As shown above, 100% outcoupling can also be achieved with a conventional plano-convex outcoupling component, but only if the radius of the outcoupling component is significantly greater than the radius of the OLED. In contrast, according to embodiments disclosed herein, for an OLED with 100% outcoupling efficiency, the OLED can be made larger and the outcoupling component can be made smaller than for the simple planar-convex outcoupling component taught previously. Accordingly, a resulting luminaire can be made brighter and lighter than would be the case for a luminaire incorporating the simple planar-convex outcoupling component. The advantage is shown quantitatively in the Table below. In the one dimensional case (cylindrical) the luminaire can be 1.7× brighter and 0.65× the weight of the solid, half cylinder equivalent. In the two dimensional case (hemispherical) the luminaire can be 2.0× brighter and 0.80× the weight of the solid hemispherical equivalent. The one dimensional and two dimensional outcouplers modeled in the table are shown in FIG. 13.

|  |  | Hemispherical Cylinder | Concentric Cylinders | Advantage of Invention (n = 1.7) |
|---|---|---|---|---|
| One dimensional geometry: cylinder | Brightness (~OLED Length) | $2A = \dfrac{2R}{n}$ | $\pi r = \dfrac{\pi R}{n}$ | $\dfrac{\pi}{2} = 1.7$ |
|  | Weight (~outcoupler volume) | $\dfrac{\pi R^2}{2}$ | $\dfrac{\pi R^2}{2} - \dfrac{\pi r^2}{2} = \dfrac{\pi R^2}{2}\left(1 - \dfrac{1}{n^2}\right)$ | $\left(1 - \dfrac{1}{n^2}\right) = 0.65$ |
| Two dimensional geometry: hemispheres | Brightness (~OLED Area) | $\pi A^2 = \dfrac{\pi R^2}{n^2}$ | $2\pi r^2 = \dfrac{2\pi R^2}{n^2}$ | 2 |
|  | Weight (~outcoupler volume) | $\dfrac{2\pi}{3} R^3$ | $\dfrac{2\pi}{3} R^3 \left(1 - \dfrac{1}{n^3}\right)$ | $\left(1 - \dfrac{1}{n^3}\right) = 0.80$ |

Figure 14:
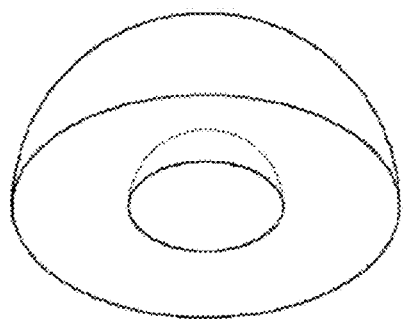
FIG. 14 shows a luminaire including a curved outcoupling component in two dimensions (spherical) according to an embodiment of the invention.
Figure 15A:
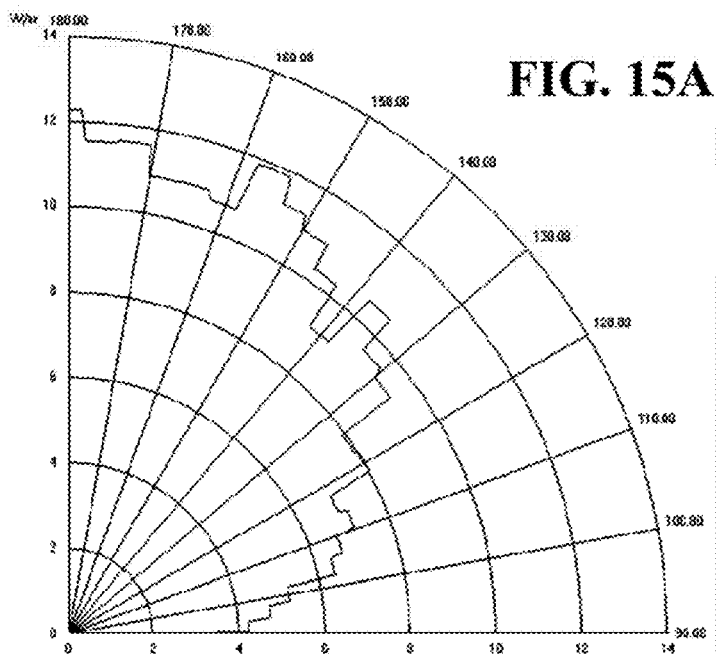
FIGS. 15A and 15B show polar plots of output power per unit solid angle (W/sr) as a function of angle for a curved substrate, and a flat substrate with a dome outcoupling component, respectively.
Figure 15B:
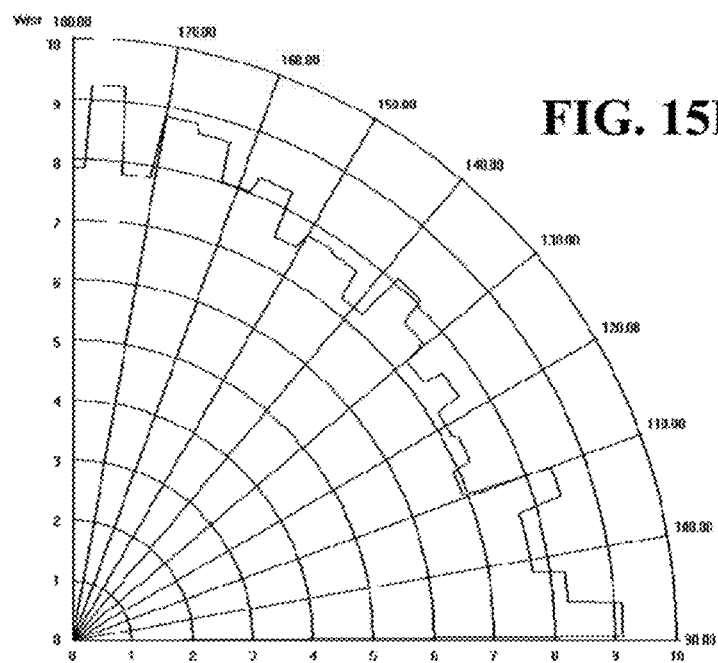
Figure 16:
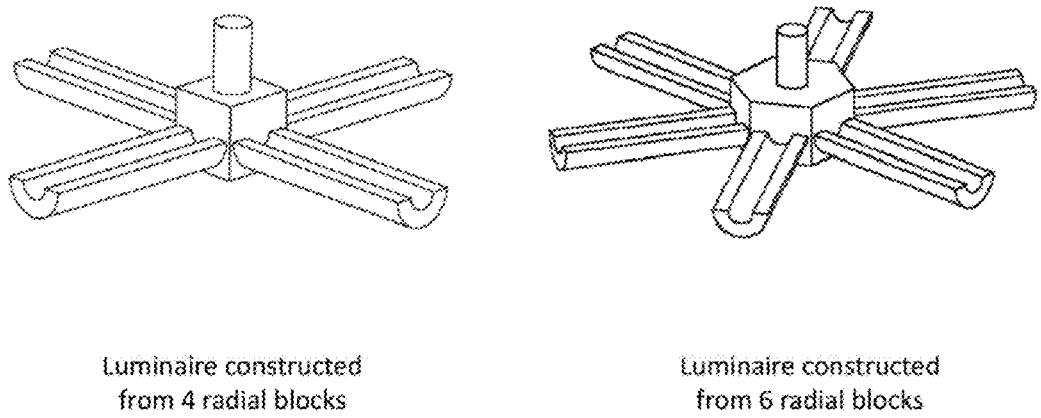
FIG. 16 shows luminaire having 4-fold symmetry and 6-fold symmetry according to an embodiment of the invention.

An advantage of the cylindrical geometry may be that it enables the OLED to be fabricated separately from the outcoupling component on a flexible substrate, which is subsequently laminated to the outcoupling component. Cylindrical symmetry also may be desirable for certain applications such as wall lighting sconces and the like. However, many lighting applications require circularly symmetric light, rather than the cylindrically symmetric output of the concentric cylindrical outcoupling component. The light output of a concentric cylindrical outcoupling component, such as shown in FIG. 14, provides a radially uniform distribution of light output. The expected light output distribution as a function of polar angle was calculated using a ray tracing model. A planar substrate produces a Lambertian distribution of light intensity with respect to angle, as shown in Luminaire plot FIG. 15A. The angular distribution of light output from a cylindrical outcoupling component is nearly uniform, as shown in FIG. 15B. To expand the lighting symmetry achievable with embodiments disclosed herein, it may be preferred to use multiple cylindrical OLEDs radiating from a central pivot, for example, four or six such OLEDs, as shown in FIG. 16. Cylindrical OLEDs in such a configuration and in other configurations contemplated herein may or may not be coplanar. That is, such a fixture may extend into a third dimension in a generally conical shape.

Figure 17:
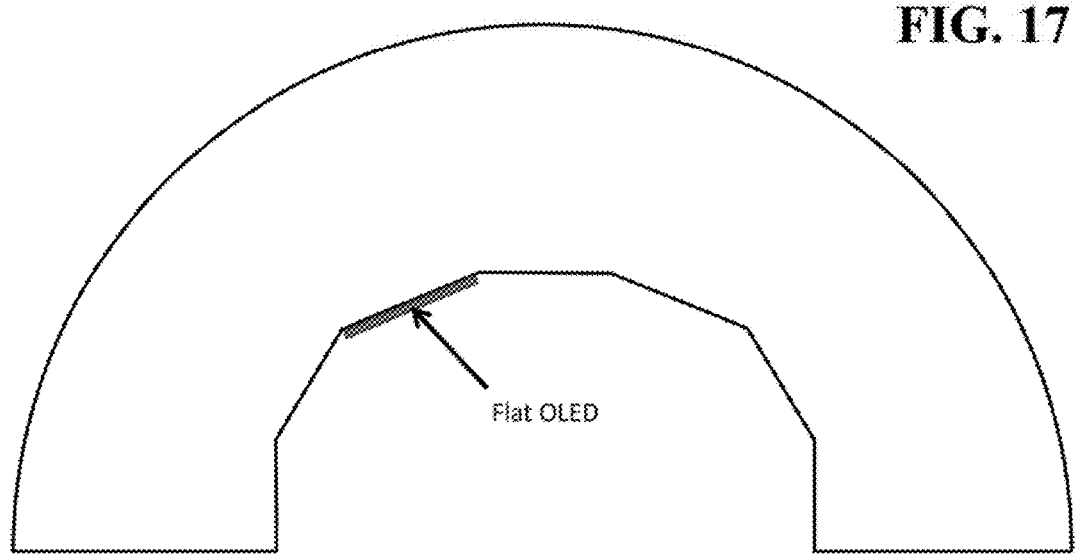
FIG. 17 shows a schematic illustration of a device including a flat and segmented OLED according to an embodiment of the invention.

FIG. 17 shows an embodiment in which a device includes multiple flat segments. In such a configuration, the OLED no longer exhibits continuous curvature parallel to the outer surface of the outcoupling component, but is made up of multiple flat segments. Up to 100% outcoupling efficiency may still be achieved if the outcoupling component is thicker than the critical ratio derived for the concentric cylinder case.

Figure 18:
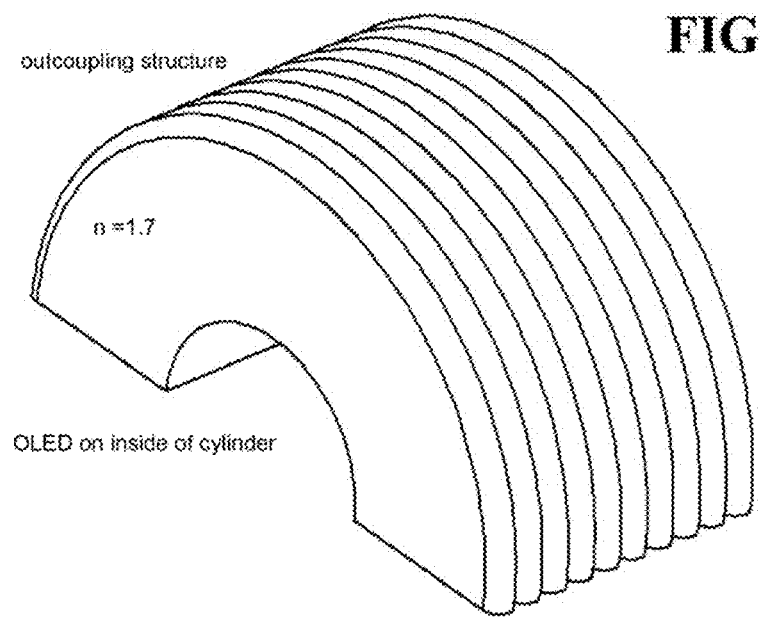
FIG. 18 shows an example of a segmented cylindrical outcoupling component according to an embodiment of the invention.
Figure 19:
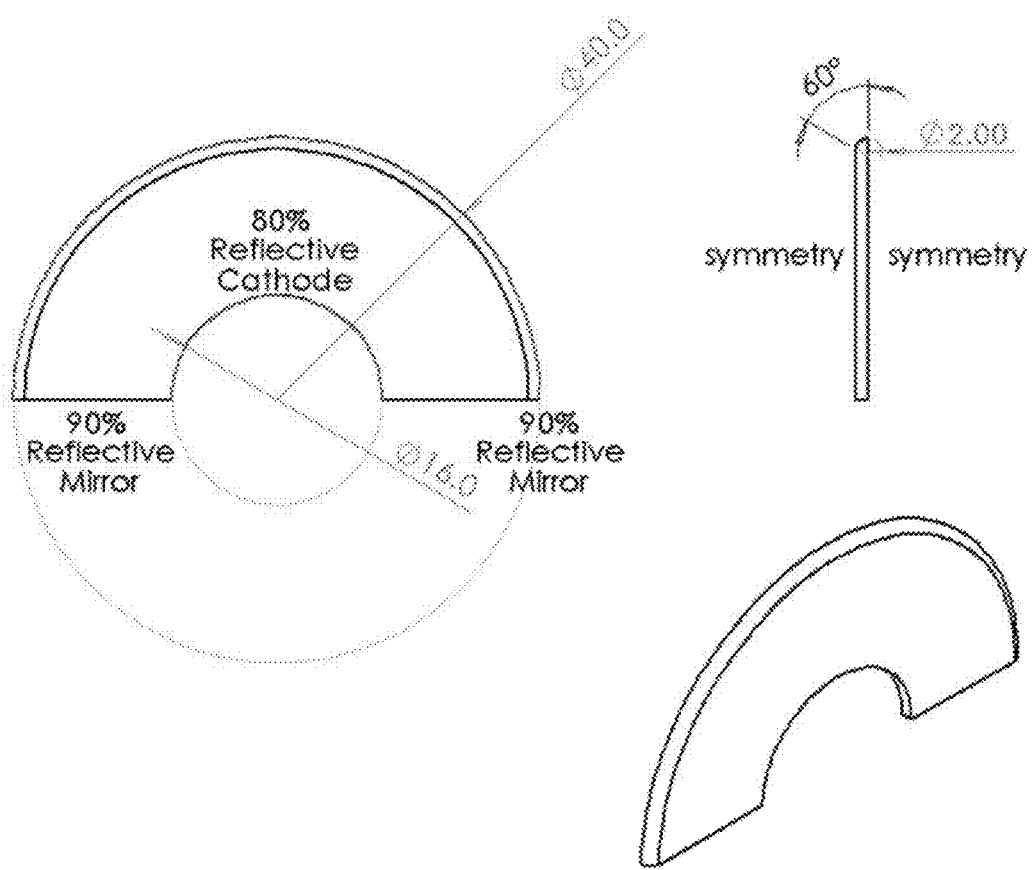
FIG. 19 shows an example of a single half-segment of the segmented cylindrical outcoupling component including the curvature of the segment ridge according to an embodiment of the invention.

Generally for cylindrical geometry, perfect outcoupling may be achievable only in one dimension, i.e., perpendicular to the axis of the cylinder. Light emitted from the OLED and traveling down the axis of the cylinder is effectively in a parallel plate geometry, and typically benefits from no outcoupling enhancement. Such an arrangement may be improved by employing a stacked series of short cylinders, where each cylinder also has curvature in the third dimension, as shown in FIG. 18. Detail of an individual segment is shown in FIG. 19. Each segment may be arranged to meet the outcoupling criteria previously described. That is, each segment may have a corresponding index of refraction $n_s$, inner radius $r_s$, and outer radius $R_s$, such that $R_s-r_s>(n_s-1)r_s$, for each segment. Each segment may include the same material and thus may have the same index of refraction, or different segments may have different indices of refraction. In the latter case, each segment still may be configured to meet the outcoupling criteria, since each segment may have different radii $r_s$ and $R_s$. Although shown and described as having circular shapes for ease of illustration, one or more of the segments also may have flat or other surfaces at the distance r as previously described.

Figure 21:
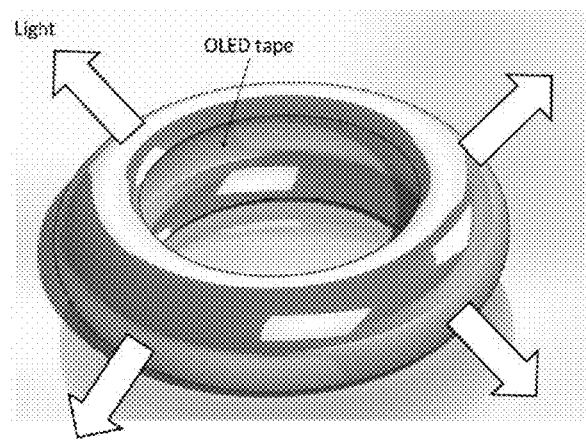
FIG. 21 shows an outcoupling component is curved in two dimensions to make a toroidal shape and providing up to 100% outcoupling in both dimensions and 360° light coverage according to an embodiment of the invention.
Figure 22:
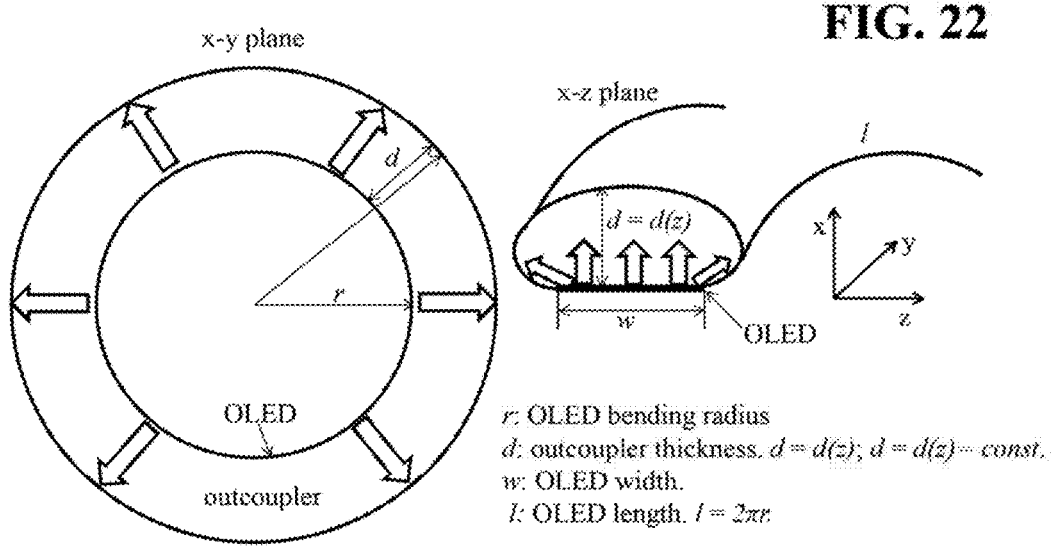
FIG. 22 shows a cross-section of an outcoupling component as shown in FIG. 21.

FIGS. 21 and 22 show additional examples of devices having cylindrical geometry. In this configuration the cylinder is bent along its axis to form a toroidal shape, thus enabling 360° light emission. Up to 100% outcoupling efficiency can be achieved for the toroidal outcoupler in FIG. 21 if its inner and outer radii of the toroid obey an outcoupling criteria as previously discussed, i.e., $r_{outer}/r_{inner}>n$, where n is the refractive index of the outcoupler.

As described previously, 100% outcoupling of waveguided light may be achievable using an outcoupling component with two curved surfaces when the following condition is met: $R/r>n_{block}$, i.e., $R-r>(n_{block}-1)r$. Thus, in many applications such a configuration will be preferred to a conventional dome design. However, in some applications such a configuration may be relatively bulky, and obtaining a relatively thick outcoupling component with a relatively high refractive index and high transparency may be relatively difficult and/or expensive.

Figure 23:
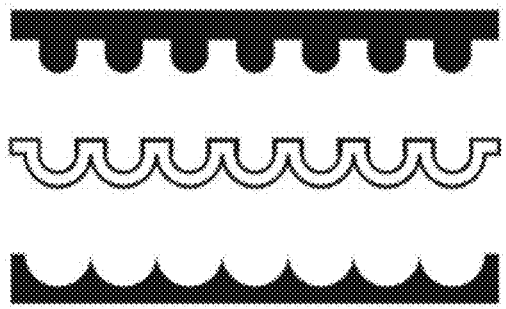
FIG. 23 shows a schematic representation of an example of micro-wells suitable for use with an outcoupling component according to an embodiment of the invention.
Figure 24:
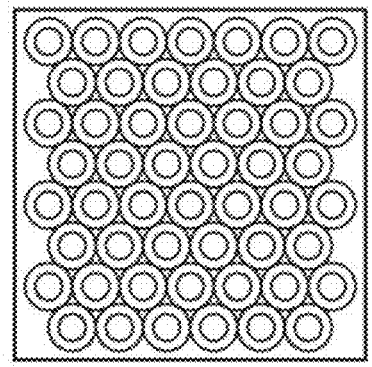
FIG. 24 shows a top view of micro-wells as shown in FIG. 23 according to an embodiment of the invention.

To address these issues, the curved substrate may be miniaturized, and thin substrates with micro-wells may be used. FIG. 23 shows a schematic representation of an example of such a configuration. For example, a plastic material may be placed between two rigid molds. The molds may be pushed together to form a substrate with microwells. In some cases the plastic may be heated to facilitate the process, and/or the raw material may be heated and applied between the molds to form the substrate. FIG. 24 shows a schematic top view of such a substrate. A microwell substrate may be advantageous because it may be relatively light-weight and thin, and may be flexible.

A micro-well substrate as described herein also may allow for a practical, high index curved substrate. For example, PEN plastic has a refractive index of ~1.7. With this high index substrate, the organic/anode mode waveguided light becomes relatively very weak, and most of the light is able to enter the substrate. As previously described, 100% of the light in the substrate can be extracted when the condition $t=R-r=r(n_{block}-1)$ is met. With a PEN substrate ($n_{block}=1.7$), this corresponds to r=35 μm, R=35 μm and t=25 μm, all of which are practical and readily achievable with plastic films.

The use of a micro-well substrate also may be advantageous because the aperture ratio AR, which is defined as the ratio of emissive area t substrate area in two dimensions, is twice as big as the micro-lens configuration with a lens radius of 60 μm and OLED radius of 35 μm. In a close-packed configuration (e.g., 90.7% packing efficiency), the aperture ratio may be calculated as: $AR=(0.907)(2)(r2)/R2$. For the example structure described above, this results in an AR of 62.7%.

The use of a micro-well substrate as described also may be advantageous because it is known in the field of fiber optics that waveguided light in the fiber can escape when the fiber is bent. When the waveguide is bent, the incident angle at the interface changes. For an OLED disposed on the inside surface of a micro-well, the incident angles becomes smaller as the anode/organic waveguided light reaches the ITO-substrate interface. Light will escape when the incident angle becomes smaller than the critical angle. This effect becomes more significant when the bending radius is small. Thus, a micro-well structure as previously described may be able to extract even more light out of the anode/waveguided mode.

Embodiments disclosed herein may be fabricated using a variety of techniques. For example, a flexible OLED may be fabricated and laminated or otherwise combined with a curved outcoupling component as previously described. As another example, an OLED may be deposited directly on an inner surface of a curved outcoupling component.

In a spherical configuration, it may not be possible to simultaneously bend an OLED in two orthogonal dimensions to fit into the luminaire. Thus, in some embodiments an OLED may be directly deposited on the luminaire as previously described. In some embodiments, an encapsulation layer may be provided over the OLED. In some embodiments, multiple relatively small OLEDs may be laminated to the inner surface of an outcoupling component without precisely conforming to the spherical shape. Such a configuration may somewhat reduce the outcoupling efficiency, but may still provide an improvement over a conventional flat substrate. In a similar configuration, the inner surface of an outcoupling component may include an array of flat facets rather than a continuous curve, thus enabling intimate contact with multiple flat, rigid or flexible OLEDs to be achieved. For example, a separate OLED may be deposited, laminated, or otherwise placed in optical communication with each of the facets.

In a cylindrical configuration, the OLED may be directly deposited onto the outcoupling component, or a flexible OLED may be laminated and/or encapsulated onto the outcoupling component in a separate step or process after fabrication of the OLED layers as previously described.

Embodiments disclosed herein may provide for OLED luminaire design that will produce a quality and directionality of light suitable for general illumination applications at both higher brightness and greater efficiency than conventional designs. Notably, a Lambertian emission profile that emerges from a flat outcoupling component generally is not suitable for most general lighting applications, which often require more light at higher angles than is achieved by approximations to Lambertian. In contrast, the emission profile of the curved OLED can be adjusted by adjusting its radius of curvature, as will be readily understood by one of skill in the art.

More generally, the total efficacy of a light source is a product of the energy efficiency of converting electrons to photons in the device, and the efficiency of coupling these photons out of the device to an observer. Embodiments disclosed herein improve the latter efficiency, increasing the outcoupling to up to 100% as previously described, while still providing aesthetically pleasing, manufacturable packages.

Experimental and Simulation

Figure 20:
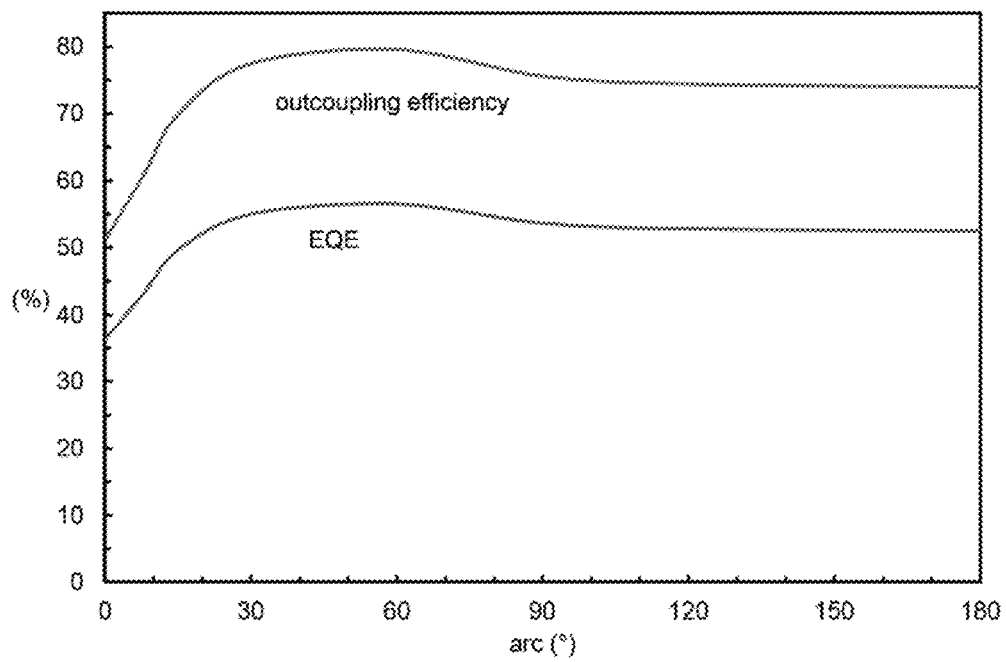
FIG. 20 shows outcoupling efficiency vs. ridge arc length for a cylindrical segment according to an embodiment of the invention.

FIG. 20 shows simulation results from a multiple-segment configuration as illustrated in FIG. 18. Simulations were performed using TracePro 3.3 from Lambda Research (Littleton, Mass.). The modeled luminaire included a hollow cylinder divided in half along an axial plane. The radius of the inner surface, $R_i$, was 8 units and the radius of the outer surface, $R_o$ was 20 units. Both surfaces spanned 180° arcs in a plane normal to the cylinder's axis. The index of refraction of the dome was n=1.7 and the luminaire material does not absorb light. Light was emitted into the luminaire from the inner surface. The trajectories of the rays were stochastically chosen to represent uniform distribution of light, such that the luminous intensity of emitted light is independent of polar and azimuthal angle at each point on the inner surface. The inner radius of the cylinder behaves as a specular mirror with 80% reflectivity to incident light. The remaining 20% of light is absorbed. This approximates the effect of an OLED structure in optical contact with a luminaire with the same index of refraction. When a light ray crosses the luminaire-to-air interface, it split into specularly reflected and transmitted beams with relative intensities governed by the Fresnel Equations. The path of the refracted beam obeys Snell's law. The planar surfaces joining the inner and outer curved surfaces of the luminaire were assumed to be 90% reflective metal mirrors. Light outcouples to air across the outer curved surface of the luminaire.

The surface of the half-cylinder was divided normal to the axis into periodic segments 1 unit thick. The axis-normal boundaries of the segments were perfectly reflecting mirrors, establishing a symmetry boundary condition that approximates an arbitrarily long cylinder. The outer surface of the segment may have a ridged structure to simulate a half-cylinder luminaire with ridged segments. If the segment is ridged, the outer surface is also curved along an arc in a plane normal to the tangent of half cylinder's base. The apex of the arc (furthest point from the axis of the cylinder) is along one axis-normal boundary and its lowest point of the arc (closest point to the axis) is on the other. Arc angle, and therefore radius of curvature of the ridge were varied as a simulation parameter. Ten thousand rays were traced through the luminaire from evenly distributed random starting points on the inner radius. Light outcoupling is expressed by the fraction of light emitted into the hemisphere from the disc that leaves the hemisphere at its air interface. This number is calculated by summing the strengths of the rays that have passed through the luminaire and into the air. Estimates of external quantum efficiency (EQE) assume that 71% of light generated in the OLED is outcoupled to the luminaire.

It is understood that the various embodiments described herein are by way of example only, and are not intended to limit the scope of the invention. For example, many of the materials and structures described herein may be substituted with other materials and structures without deviating from the spirit of the invention. The present invention as claimed may therefore include variations from the particular examples and preferred embodiments described herein, as will be apparent to one of skill in the art. It is understood that various theories as to why the invention works are not intended to be limiting.

The invention claimed is:

1. A device comprising:
    an OLED; and
    a curved outcoupling component comprising a material having an index of refraction n that is equal to or higher than that of a substrate of the OLED, the curved outcoupling component having a curved outer surface with radius R and an inner surface with which the OLED is optically coupled, wherein all emissive elements of the OLED are within a distance r of the center of curvature of the outer surface of the curved outcoupling component, and wherein $R-r>(n-1)r.$ 2. The device of claim 1, wherein at least one surface of the curved outcoupling component is reflective.
3. The device of claim 1, wherein a surface at an inner radius of the inner surface is substantially parallel to a surface at an outer radius of the curved outer surface.
4. The device of claim 1, wherein the curved outcoupling component comprises a plurality of outcoupling structures, each structure s having a corresponding index of refraction $n_s$, inner dimension $r_s$, and outer radius $R_s$, wherein $R_s-r_s>(n_s-1)r_s$ independently for each structure.
5. The device of claim 4, wherein the plurality of outcoupling structures are provided by a plurality of micro-wells, each micro-well corresponding to one of the outcoupling structures.
6. The device of claim 1, further comprising a substantially planar surface disposed along the inner surface.
7. The device of claim 6, further comprising a plurality of substantially planar surfaces disposed within a region located at the inner surface.
8. The device of claim 1, wherein the curved outcoupling component is substantially toroidal.
9. The device of claim 8, further comprising a reflective surface disposed above the curved outcoupling component.
10. The device of claim 1, wherein the OLED is a flexible OLED disposed on a surface of the curved outcoupling component at the inner surface.
11. The device of claim 10, wherein the curved outcoupling component is transparent to light emitted by the OLED.
12. The device of claim 1, wherein n>1.7.
13. The device of claim 1, wherein at least 98% of light emitted by the OLED is outcoupled by the curved outcoupling component.
14. The device of claim 1, further comprising an optical coupling layer disposed at least partially between the OLED and the curved outcoupling component.
15. The device of claim 14, wherein the optical coupling layer has an index of refraction not less than the index of refraction of the curved outcoupling component.
16. The device of claim 1, wherein the OLED is disposed on a surface of the curved outcoupling component at the inner radius r.
17. The device of claim 1, wherein r and R are not constant across the curved outcoupling component.
18. The device of claim 1, wherein n is equal to or higher than 1.65.
19. A method of fabricating a light-emitting device, the method comprising:
    obtaining a curved outcoupling component comprising a material having an index of refraction n that is equal to or higher than that of a substrate of an OLED, the curved outcoupling component having a curved outer surface with outer radius R; and
    placing the OLED in optical communication with the curved outcoupling component;
    wherein all emissive elements of the OLED are disposed within a distance r of the center of curvature of the outer surface of the curved outcoupling component, wherein $R-r>(n-1)r.$
20. The method of claim 19, wherein placing the OLED in optical communication with the curved outcoupling component comprises depositing the OLED on an inner surface of the outcoupling component located at the radius r.

21. The method of claim 19, further comprising obtaining a flexible OLED, wherein placing the OLED in optical communication with the curved outcoupling component comprises attaching the flexible OLED to the curved outcoupling component.

* * * * *